(12) United States Patent
Paz de Araujo et al.

(10) Patent No.: US 11,258,010 B2
(45) Date of Patent: Feb. 22, 2022

(54) FORMATION OF A CORRELATED ELECTRON MATERIAL (CEM)

(71) Applicant: Cerfe Labs, Inc., Austin, TX (US)

(72) Inventors: Carlos Alberto Paz de Araujo, Colorado Springs, CO (US); Saurabh Vinayak Suryavanshi, Mountain View, CA (US); Lucian Shifren, San Jose, CA (US); Jolanta Bozena Celinska, Colorado Springs, CO (US)

(73) Assignee: Cerfe Labs, Inc., Austin, TX (US)

( * ) Notice: Subject to any disclaimer, the term of this patent is extended or adjusted under 35 U.S.C. 154(b) by 0 days.

(21) Appl. No.: 16/569,495

(22) Filed: Sep. 12, 2019

(65) Prior Publication Data

US 2021/0083186 A1    Mar. 18, 2021

(51) Int. Cl.
  *H01L 45/00* (2006.01)
(52) U.S. Cl.
  CPC .......... *H01L 45/1641* (2013.01); *H01L 45/08* (2013.01); *H01L 45/1233* (2013.01); *H01L 45/141* (2013.01); *H01L 45/146* (2013.01); *H01L 45/165* (2013.01); *H01L 45/1658* (2013.01)
(58) Field of Classification Search
  CPC ............... H01L 45/1641; H01L 45/165; H01L 45/1658
  See application file for complete search history.

(56) References Cited

U.S. PATENT DOCUMENTS

| | | | |
|---|---|---|---|
| 7,298,640 B2 | 11/2007 | Chen et al. | |
| 7,639,523 B2 | 12/2009 | Celinska et al. | |
| 7,778,063 B2 | 8/2010 | Brubaker et al. | |
| 7,872,900 B2 | 1/2011 | Paz De Araujo et al. | |
| 9,627,615 B1 | 4/2017 | Reid et al. | |
| 9,997,702 B2 | 6/2018 | Reid et al. | |
| 10,002,665 B1 | 6/2018 | Bhargava et al. | |
| 2008/0107801 A1 | 5/2008 | Celinska et al. | |
| 2013/0285699 A1 | 10/2013 | McWilliams et al. | |
| 2016/0163978 A1 | 6/2016 | Paz De Araujo et al. | |
| 2017/0213960 A1 | 7/2017 | Paz De Araujo et al. | |
| 2017/0237001 A1 | 8/2017 | Reid et al. | |
| 2017/0301859 A1 | 10/2017 | Paz De Araujo et al. | |

(Continued)

FOREIGN PATENT DOCUMENTS

| | | |
|---|---|---|
| WO | 2008058264 A2 | 5/2008 |
| WO | 2017141042 A1 | 8/2017 |
| WO | 2020030887 A1 | 2/2020 |

OTHER PUBLICATIONS

Notification of Transmittal of the International Search Report and the Written Opinion of the International Searching Authority, or the Declaration, App. No. PCT/GB2020/052038, dated Nov. 24, 2020, 1 Page.

(Continued)

*Primary Examiner* — Grant S Withers
(74) *Attorney, Agent, or Firm* — Berkeley Law & Technology Group, LLP

(57) ABSTRACT

Subject matter disclosed herein may relate to fabrication of a correlated electron material (CEM) such as in a CEM device capable of switching between and/or among impedance states. In particular embodiments, a CEM may be formed from one or more transition metal oxides (TMOs), one or more post transition metal oxides (PTMOs) or one or more post transition metal chalcogenides (PTMCs), or a combination thereof.

20 Claims, 4 Drawing Sheets

(56) References Cited

U.S. PATENT DOCUMENTS

| | | |
|---|---|---|
| 2018/0013062 A1 | 1/2018 | Reid et al. |
| 2018/0019394 A1 | 1/2018 | Reid et al. |
| 2018/0047897 A1 | 2/2018 | Reid et al. |
| 2018/0047900 A1 | 2/2018 | Reid et al. |
| 2018/0053892 A1 | 2/2018 | Reid et al. |
| 2018/0096713 A1 | 4/2018 | Chandra et al. |
| 2018/0159028 A1 | 6/2018 | Shifren et al. |
| 2018/0159029 A1 | 6/2018 | Paz De Araujo et al. |
| 2018/0159031 A1 | 6/2018 | Paz De Araujo et al. |
| 2018/0175290 A1 | 6/2018 | Reid et al. |
| 2018/0212146 A1 | 7/2018 | Shifren et al. |
| 2019/0006588 A1 | 1/2019 | Paz De Araujo et al. |
| 2020/0295260 A1 | 9/2020 | Huang et al. |

OTHER PUBLICATIONS

International Search Report, App. No. PCT/GB2020/052038, dated Nov. 24, 2020, 6 Pages.
Written Opinion of the International Searching Authority, App. No. PCT/GB2020/052038, dated Nov. 24, 2020, 8 Pages.
Application as filed for U.S. Appl. No. 16/163,190, filed Oct. 17, 2018, 82 Pages.
Application as filed for U.S. Appl. No. 16/163,246, filed Oct. 17, 2018, 87 Pages.
Application as filed for U.S. Appl. No. 16/206,725, filed Nov. 30, 2018, 101 Pages.
Application as filed for U.S. Appl. No. 16/057,515, filed Aug. 7, 2018, 70 Pages.
Office Action for U.S. Appl. No. 16/057,515, dated Jun. 5, 2019, 145 Pages.
Response to Office Action as filed for U.S. Appl. No. 16/057,515, filed Sep. 5, 2019, 21 Pages.

300

350

FORMATION OF A CORRELATED ELECTRON MATERIAL (CEM)

BACKGROUND

Field

This disclosure relates to correlated electron material (CEM), and may relate, to approaches for fabricating CEM, such as may be used in switches, memory circuits, and so forth, which may exhibit desirable impedance switching characteristics.

Information

Integrated circuit devices, such as electronic switching devices, for example, may be found in numerous types of electronic devices. For example, memory and/or logic devices may incorporate electronic switches suitable for use in computers, digital cameras, smart phones, computing devices, wearable electronic devices, and so forth. Factors that may relate to electronic switching devices, which may be of interest to a designer in considering whether an electronic switching device is suitable for particular applications, may include physical size, storage density, operating voltages, impedance ranges, switching speed, and/or power consumption, for example. Other factors may include, for example, cost and/or ease of manufacture, scalability, and/or reliability.

However, conventional fabrication techniques, which may be suitable for certain types of memory and/or logic devices, may not be suited for use in fabricating correlated electron material devices that exhibit desired switching capabilities and/or impedance properties.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Figure 1A:
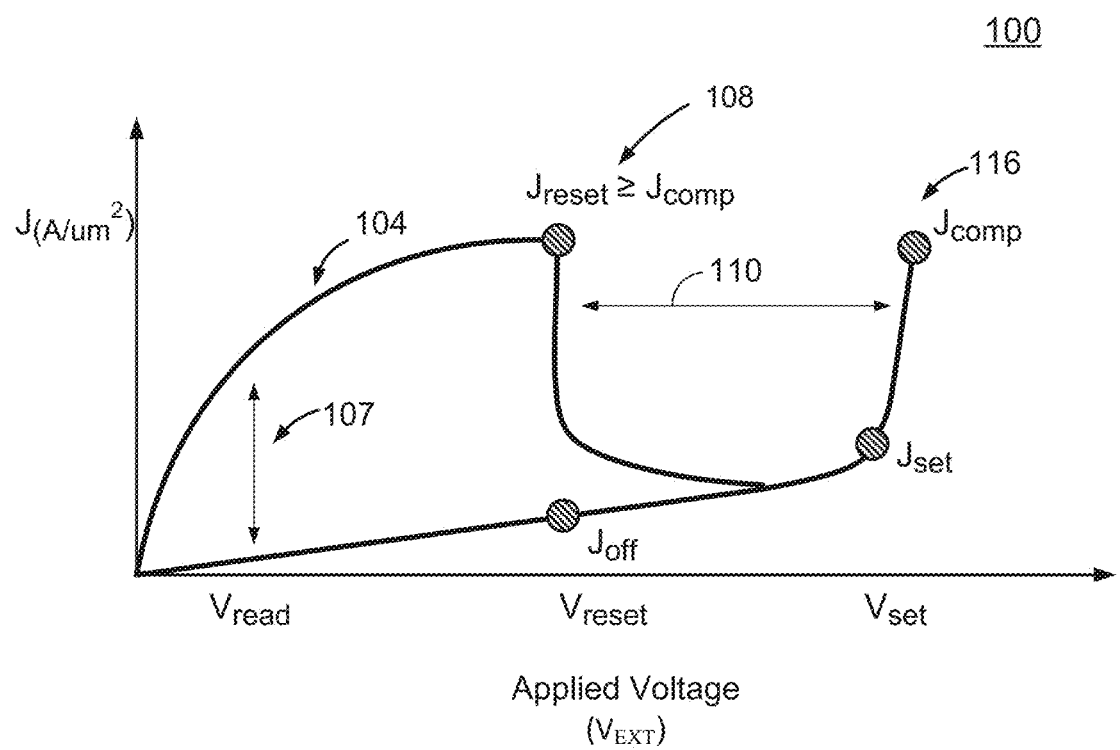
FIG. 1A is an illustration of an embodiment of a current density versus voltage profile of a device formed from a correlated electron material.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

References throughout this specification to one implementation, an implementation, one embodiment, an embodiment, and/or the like indicates that a particular feature, structure, characteristic, and/or the like described in relation to a particular implementation and/or embodiment is included in at least one implementation and/or embodiment of claimed subject matter. Thus, appearances of such phrases, for example, in various places throughout this specification are not necessarily intended to refer to the same implementation and/or embodiment or to any one particular implementation and/or embodiment. Furthermore, it is to be understood that particular features, structures, characteristics, and/or the like described are capable of being combined in various ways in one or more implementations and/or embodiments and, therefore, are within intended claim scope. In general, of course, as has been the case for the specification of a patent application, these and other issues have a potential to vary in a particular context of usage. In other words, throughout the disclosure, particular context of description and/or usage provides helpful guidance regarding reasonable inferences to be drawn; however, likewise, "in this context" in general without further qualification refers to the context of the present disclosure.

Particular aspects of the present disclosure describe different possible compositions of a correlated electron material (CEM) and methods and/or processes for preparing and/or fabricating CEM films to form, for example, a correlated electron switch, such as may be utilized to form a correlated electron random access memory (CERAM), and/or logic devices, for example. Correlated electron materials, which may be utilized in the construction of CERAM devices and CEM switches, for example, may also comprise a wide range of other electronic circuit types, such as, for example, memory controllers, memory arrays, filter circuits, data converters, optical instruments, phase locked loop circuits, microwave and millimeter wave transceivers, and so forth, although claimed subject matter is not limited in scope in these respects.

As discussed herein, a bulk CEM for a device may be formed at least in part by application of a dopant to a host material comprising a post transition metal oxide (PTMO) and/or a post transition metal chalcogenide (PTMC). In a particular implementation, a p-orbital of an oxygen atom of a PTMO may form a hybrid orbital with an s- and p-orbitals of a metal atom. Likewise, a p-orbital of a chalcogenide atom of a PTMC may form a hybrid orbital with an s- and p-orbitals of a metal atom. An applied dopant may supply a ligand to at least in part replace oxygen in a PTMO and/or a chalcogen in a PTMC to reduce a bandgap, thereby inducing a p-type behavior in the resulting material.

In this context, a CEM switch, for example, may exhibit a substantially rapid conductive-state-to-insulative-state, which may be enabled, at least in part, by electron correlations, which modify electrical properties of the material, rather than solid-state structural phase changes, such as in response to a change from a crystalline to an amorphous state, for example. Such solid-state structural phase changes, such as from crystalline to amorphous states, for example, may bring about formation of conductive filaments in certain resistive RAM devices. In one aspect, a substantially rapid conductor-to-insulator transition in a CEM device may occur responsive to a quantum mechanical phenomenon that takes place within a bulk of a material in such a CEM device, in contrast to melting/solidification or localized filament formation, for example, in phase change and certain resistive RAM devices. Such quantum mechanical transitions between relatively conductive and relatively insulative states, and/or between a first impedance state and a second, dissimilar impedance state, for example, in a CEM device may be understood in any one of several aspects. As used herein, the terms "relatively conductive state," "relatively lower impedance state," and/or "metal state" may be interchangeable, and/or may, at times, be referred to as a "relatively conductive and/or lower-impedance state." Likewise, the terms "relatively insulative state" and "relatively higher impedance state" may be used interchangeably herein, and/or may, at times, be referred to as a "relatively insulative and/or higher impedance state." Further, in a relatively insulative and/or higher-impedance state, a CEM may be characterized by first a range of impedances and, in a relatively conductive and/or lower-impedance state, a CEM may be characterized by a second range of impedances. In embodiments, the first range of impedances may be significantly dissimilar to the second range of impedances.

As described herein, a suitable CEM for forming a device may be formed from any one of several metal oxide bulk materials such as, for example materials of a class of transition metal oxides (TMOs) or post transmission metal oxides (PTMOs). A suitable CEM for forming a device may also be formed from a post transition metal chalcogenides (PTMCs). In particular implementations, a bulk CEM for a device may comprise a composition of one or more TMOs, one or more PTMOs or one or more PTMCs, or any combination thereof. As such, a CEM (e.g., to be implemented as a bulk material for a device) may not be limited to materials formed from TMOs, PTMOs or PTMCs, but may be formed from other materials having particular behavior properties.

In particular implementations, a TMO-based CEM may be formed from oxides of one or more "d-block" elements or compounds of "d-block" elements, which correspond to transition metals or TMOs. CEM devices may also be implemented utilizing one or more "f-block" elements or compounds of "f-block" elements. A CEM may comprise one or more rare earth elements, oxides of rare earth elements, oxides comprising one or more rare earth transition metals, perovskites, yttrium, and/or ytterbium, or any other compounds comprising metals from the lanthanide or actinide series of the periodic table of the elements, for example, and claimed subject matter is not limited in scope in this respect.

A "ligand" as referred to herein means an ion or molecule or element attached to a metal atom by coordinate bonding. In the case of a metal oxide or metal chalcogenide, for example, such a ligand may comprise ions of oxygen or a chalcogenide bonding to a metal ion. In a process to form a CEM (e.g., to enhance switching properties), a dopant may be applied to a host material (e.g., a metal oxide and/or metal chalcogenide). In this context, a "dopant" or "doping agent" as referred to herein means an impurity that is introduced into a host material to alter one or more original or inherent electrical and/or optical properties and/or other properties of the host material. In one embodiment of a metal oxide or metal chalcogenide host material, oxygen and/or a chalcogenide may serve as "intrinsic ligands." In this context, "intrinsic ligand" as referred to herein means an ion or molecule attached to a metal in a host material prior to processing of the host material such as by application of a dopant. In a particular implementation of a process to form a bulk material having desired properties (e.g., a CEM), application of a dopant may introduce a ligand capable of bonding with a metal of a host material such as carbon, carbon compounds, and/or CO. In this context, an "extrinsic ligand" as referred to herein means a ligand introduced into a host material capable of binding with molecules of a host material. An extrinsic ligand may, for example, form a pi-back bond with the metal ion, which induces a p-type doping the material.

A CEM may additionally comprise a dopant, such as a carbon-containing dopant, wherein the atomic concentration of an applied ligand (e.g., of carbon or nitrogen compounds) comprise between about 0.1% to about 20.0%, for example. As the term is used herein, a "d-block" element means an element comprising scandium (Sc), titanium (Ti), vanadium (V), chromium (Cr), manganese (Mn), iron (Fe), cobalt (Co), nickel (Ni), copper (Cu), zinc (Zn), yttrium (Y), zirconium (Zr), niobium (Nb), molybdenum (Mo), technetium (Tc), ruthenium (Ru), rhodium (Rh), palladium (Pd), silver (Ag), cadmium (Cd), hafnium (Hf), tantalum (Ta), tungsten (W), rhenium (Re), osmium (Os), iridium (Ir), platinum (Pt), gold (Au), mercury (Hg), rutherfordium (Rf), dubnium (Db), seaborgium (Sg), bohrium (Bh), hassium (Hs), meitnerium (Mt), darmstadtium (Ds), roentgenium (Rg) or copernicium (Cn), or any combination thereof. A CEM formed from or comprising an "f-block" element of the periodic table of the elements means a CEM comprising a metal or metal oxide, wherein the metal is from the f-block of the periodic table of the elements, which may include lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), actinium (Ac), thorium (Th), protactinium (Pa), uranium (U), neptunium (Np), plutonium (Pu), americium (Am), berkelium (Bk), californium (Cf), einsteinium (Es), fermium (Fm), mendelevium (Md), nobelium (No) or lawrencium (Lr), or any combination thereof.

In an aspect, a quantum mechanical transition of a CEM between a relatively insulative and/or higher impedance state and a relatively conductive and/or lower impedance state, wherein the relatively conductive and/or lower impedance state is substantially dissimilar from the insulative and/or higher impedance state, may be understood in terms of a Mott transition. In accordance with a Mott transition, a material may switch between a relatively insulative and/or higher impedance state to a relatively conductive and/or lower impedance state if a Mott transition condition occurs. The Mott criteria may be defined, at least in part, by $(n_c)^{1/3} a_B \approx 0.26$, wherein $n_c$ denotes a concentration of electrons, and wherein "$a_B$" denotes the Bohr radius. If a threshold carrier concentration is achieved, such that the Mott criteria is met, the Mott transition is believed to occur. Responsive to the Mott transition occurring, a state of a CEM device may change from a relatively higher resistance/higher capacitance state (e.g., a higher-impedance/insulative state) to a relatively lower resistance and/or lower capacitance state (e.g., a lower-impedance/conductive state) that is substantially dissimilar from the higher resistance/higher capacitance state.

In another aspect, a Mott transition may be controlled by a localization of electrons. If carriers, such as electrons, for example, are localized, a strong coulomb interaction between the carriers may split the bands of the CEM to bring about a relatively insulative (relatively higher impedance) state. If electrons are no longer localized, a weak coulomb interaction may dominate, which may give rise to a removal of band splitting. Responsive to such band splitting, a metal may transition from a relatively conductive state to a substantially dissimilar, insulative state.

Further, in an embodiment, switching from a relatively insulative and/or higher impedance state to a substantially dissimilar and relatively conductive and/or lower impedance state may enable a change in capacitance in addition to a change in resistance. For example, a CEM device may exhibit a variable resistance together with a property of variable capacitance. In other words, impedance characteristics of a CEM device may include both resistive and capacitive components (e.g., as illustrated by variable resistor 126 and variable capacitor 128 in FIG. 1B). For example, in a metallic state, a CEM device may comprise a relatively low electric field that may approach zero, and thus may exhibit a substantially low capacitance, which may likewise approach zero.

Similarly, in a relatively insulative and/or higher impedance state, which may be brought about by bound or correlated electrons, an external electric field may be capable of penetrating a CEM and, therefore, the CEM may exhibit higher capacitance based, at least in part, on additional charges stored within the CEM. Thus, for example, a transition from a relatively insulative and/or higher impedance state to a substantially dissimilar and relatively conductive and/or lower impedance state in a CEM device may result in changes in both resistance and capacitance, at least in particular embodiments. Such a transition may bring about additional measurable phenomena, and claimed subject matter is not limited in this respect.

In an embodiment, a device formed from a CEM may exhibit switching of impedance states responsive to a Mott-transition in a majority of the volume of the CEM comprising a CEM-based device. In an embodiment, a CEM may form a "bulk switch." As used herein, the term "bulk switch" refers to at least a substantial volume of a CEM switching a device's impedance state, such as in response to a Mott-transition, for example. It should be understood, however, that material forming a bulk switch may transition between impedance states responsive to phenomena other than a Mott-transition, and that claimed subject matter is not limited in this respect. In an embodiment, substantially all CEM of a device may switch between a relatively insulative and/or higher impedance state and a relatively conductive and/or lower impedance state (e.g., a "metal" or "metallic state") responsive to a Mott transition, or from a relatively conductive and/or lower impedance state to a relatively insulative and/or higher impedance state responsive to a reverse Mott transition.

Figure 1B:
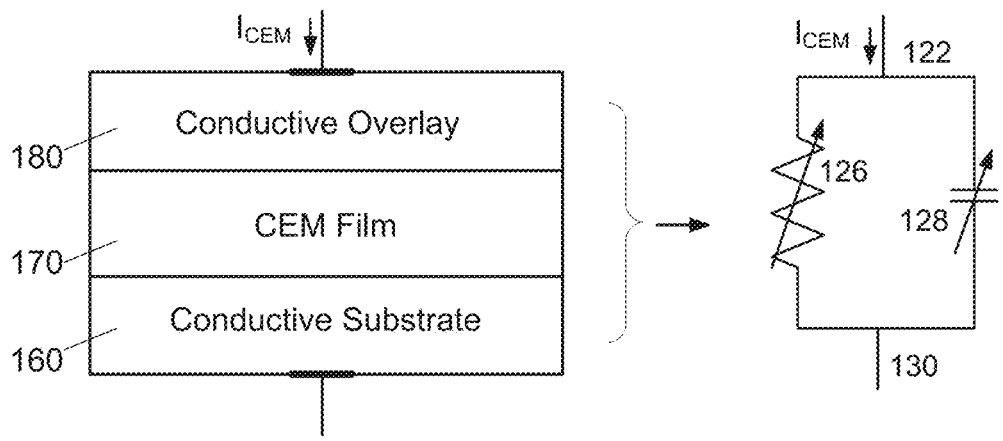
FIG. 1B is an illustration of an embodiment of a switching device comprising a correlated electron material and a schematic diagram of an equivalent circuit of a correlated electron material switch.

FIG. 1A is an illustration of an embodiment 100 of a current density (J) versus an applied voltage ($V_{EXT}$) for a device formed from a CEM. At least partially in response to a voltage applied to terminals of a CEM device, for example, during a "write operation," the CEM device may be placed into a relatively low-impedance/conductive state or a relatively high-impedance/insulative state. For example, application of a voltage $V_{set}$ and a current density $J_{set}$ may enable a transition of the CEM device to a relatively low-impedance/conductive state. Conversely, application of a voltage $V_{reset}$ and a current density $J_{reset}$ may enable a transition of the CEM device to a relatively high-impedance/insulative state. As shown in FIG. 1A, reference designator 110 illustrates the voltage range that may separate $V_{set}$ from $V_{reset}$. Following placement of the CEM device into a high-impedance and/or insulative state or into a low-impedance and/or conductive state, the particular state of the CEM device may be detected by application of a voltage $V_{read}$ (e.g., during a read operation) and detection of a current or current density at terminals of the CEM device (e.g., utilizing read window 107).

According to an embodiment, the CEM device characterized in FIG. 1A may comprise any transition metal oxide (TMO), such as, for example, perovskites, Mott insulators, charge exchange insulators, and Anderson disorder insulators, as well as post transition metal oxides (PTMOs) and post transition metal chalcogenides (PTMCs). In one aspect, the CEM device of FIG. 1A may comprise other types of switching materials, though it should be understood that these are exemplary only and are not intended to limit claimed subject matter. Nickel oxide (NiO) is disclosed as one particular TMO material. NiO materials discussed herein may be doped with substitutional ligands, such as carbon-containing materials (e.g., carbonyl (CO)) for example, which may establish and/or stabilize material properties and/or enable a p-type operation in which a CEM may be more conductive if placed into a low-impedance and/or conductive state. Thus, in another particular example, NiO doped with substitutional ligands may be expressed as NiO:$L_x$, where $L_x$ may indicate a ligand element or compound and x may indicate a number of units of the ligand for one unit of NiO. A value of x may be determined for any specific ligand and any specific combination of ligand with NiO or with any other transition metal compound by balancing valences. Other dopant ligands, which may enable and/or increase conductivity in a low-impedance/conductive state in addition to carbonyl may include: nitrosyl (NO), an isocyanide (RNC wherein R is H, $C_1$-$C_6$ alkyl or $C_6$-$C_{10}$ aryl), a phosphine ($R_3P$ wherein R is $C_1$-$C_6$ alkyl or $C_6$-$C_{10}$ aryl) for example, triphenylphosphine ($PPh_3$), an alkyne (e.g., ethyne) or phenanthroline ($C_{12}H_8N_2$), bipyridine ($C_{10}H_8N_2$), ethylenediamine ($C_2H_4(NH_2)_2$), acetonitrile ($CH_3CN$), fluoride (F), chloride (Cl), bromide (Br), cyanide (CN), sulfur (S), carbon (C), carbonyl (CO), and others. As discussed below, $Bi_2O_3$ is one particular non-limiting example of a PTMO in which may be doped with substitutional ligands, such as carbon-containing materials (e.g., C and/or CO), for example, which may establish and/or stabilize material properties and/or enable a p-type operation in which a CEM may be more conductive if placed into a low-impedance and/or conductive state.

In this context, a "p-type" doped CEM as referred to herein means a first type of CEM comprising a particular molecular dopant that exhibits increased electrical conductivity, relative to an undoped host material, while the CEM is operated in a relatively low-impedance and/or conductive state. Introduction of a ligand, such as CO, may operate to enhance the p-type nature of a NiO-based, for example. Likewise, introduction of a ligand, such as CO and/or C, may operate to enhance the p-type nature of a BiO-based CEM, for example. Accordingly, an attribute of p-type operation of a CEM may include, at least in particular embodiments, an ability to tailor and/or customize electrical conductivity of a CEM, operated in a relatively low-impedance and/or conductive state, by controlling an atomic concentration of a p-type inducing ligand from doping in a CEM. In particular embodiments, an increased atomic concentration of a p-type inducing ligand from doping may enable increased electrical conductivity of a CEM, although claimed subject matter is not limited in this respect. In particular embodiments, changes in atomic concentration or atomic percentage of p-type inducing dopant in a CEM device may be observed in the characteristics of region 104 of FIG. 1A, as described herein, wherein an increase in p-type inducing dopant brings about a steeper (e.g., more positive) slope of region 104 to indicate higher conductivity.

In another embodiment, a CEM device represented by a current density versus voltage profile of FIG. 1A, may comprise TMO, PTMO and/or PTMC materials comprising extrinsic ligands, such as carbon-containing ligands, though it should be understood that these are exemplary only and are not intended to limit claimed subject matter. A host material comprising a transition metal oxide (e.g., NiO), a post transition metal oxide (e.g., BiO) and/or a post transition metal chalcogenide (e.g., $Bi_2S_3$), for example, may be doped with substitutional ligands (e.g., carbon-containing ligands), which may stabilize switching properties in a manner similar to stabilization switching properties responsive to use of a carbon-containing dopant species (e.g., carbonyl). In a particular example, materials applicable as a dopant for NiO and/or BiO host materials disclosed herein may include nitrogen-containing molecules of the form $C_xH_yN_z$ (wherein $x \geq 0$, $y \geq 0$, $z \geq 0$, and wherein at least x, y, or z comprise values>0) such as ammonia ($NH_3$), cyano ($CN^-$), azide ion ($N_3^-$) ethylene diamine ($C_2H_8N_2$), phen(1,10-phenanthroline) ($C_{12}H_8N_2$), 2,2'bipyridine ($C_{10}H_8N_2$), ethylenediamine (($C_2H_4(NH_2)_2$), pyridine ($C_5H_5N$), acetonitrile ($CH_3CN$), and cyanosulfanides such as thiocyanate ($NCS^-$), for example. NiO switching materials disclosed herein may include members of an oxynitride family ($N_xO_y$, wherein x and y comprise whole numbers, and wherein $x \geq 0$ and $y \geq 0$ and at least x or y comprise values>0), which may include, for example, nitric oxide (NO), nitrous oxide ($N_2O$), nitrogen dioxide ($NO_2$), or precursors with an $NO_3^-$ ligand. It should be understood, however, that these are merely examples of materials applicable as a dopant for NiO and/or BiO host materials, and claimed subject matter is not limited in this respect.

In accordance with a particular implementation of a CEM device behaving according to FIG. 1A, if sufficient bias voltage is applied (e.g., exceeding a band-splitting potential) and the aforementioned Mott condition is satisfied (e.g., injected holes or extracted electrons during metallic phase are of a population comparable to a population of electrons in a switching region, for example), a CEM device may switch between a relatively low-impedance/conductive state to a relatively high-impedance and/or insulative state, for example, responsive to the reversal of the Mott metal phase. This may correspond to point 108 of the voltage versus current density profile of FIG. 1A. At, or suitably near this point, electrons may no longer be sufficient to screen potential energy of the metal ion and ligand complex. For example, at or suitably near this point, the potential energy of the metal ion and ligand complex may contain a large potential energy due to the hybridized states dominating the kinetic energy of electrons from the lower band. Such a strong potential, while unscreened by electrons, may act as a "potential well" to localize hybridized orbitals and keep the electrons localized. If a CEM device comprises a relatively high-impedance and/or insulative state, current may be generated by transportation of electrons or holes. Consequently, if a threshold voltage is applied across terminals of a CEM device, electrons may be injected into a metal-insulator-metal (MIM) diode over the potential barrier of the MIM device. In certain embodiments, injection of a threshold current of electrons, at a threshold potential applied across terminals of a CEM device, may perform a "SET" operation, which places the CEM device into a low-impedance and/or conductive state. During such a SET operation, an increase in electrons may screen the potential energy of the metal ion and ligand complex, which converts the material into metallic phase. Screening due to incoming electrons may operate to collapse a band-splitting potential, thereby giving rise to the low-impedance and/or conductive state.

In particular embodiments, changes in impedance states of a CEM device, may be brought about by "π back-donation" of electrons of compounds in which a ligand donates n electron pair to a metal ion orbital leading to the formation of a σ bond followed by back donation of an electron pair from the metal ion to an antibonding orbital of the ligand in a subsequent formation of a π back-bond. In an example, such π back-donation may occur in an application of an extrinsic ligand to a host material comprising a transition metal oxide (e.g., $Ni_xO_y$) or a post transition metal oxide (e.g., $Bi_xO_y$) (wherein the subscripts "x" and "y" comprise whole numbers). In this context, "back donation" as referred to herein means a transfer of one or more electrons from an atomic orbital of a metal atom (e.g., Ni or Bi) to an antibonding orbital of a ligand (e.g. CO). In one particular example, backdonation may occur in a host material (e.g., metal oxide) in the application of a carbon containing dopant (e.g., C or CO). Here, a carbon atom in an applied dopant may form a σ bond with a metal (e.g., of a metal oxide molecule). The a bond may overcharge the metal such that charge is returned to an orbital of a carbon compound (e.g., CO). This may induce formation of holes in a valence band, making a resulting material more p-type. This is, of course, merely an example of a back-donation process, and claimed subject matter is not limited in this respect. Back-donation may permit a metal, metal compound or metal oxide, or a combination thereof, to maintain an ionization state that is favorable to electrical conduction under an influence of an applied voltage. In certain embodiments, back-donation in a CEM, for example, may occur responsive to application of carbon-containing dopants, such as C, and/or CO, for example, which may permit a CEM to exhibit a property in which electrons are controllably, and reversibly, "donated" to a conduction band of a transition metal or transition metal oxide, such as nickel, for example, during operation of a device or circuit comprising a CEM. Back donation may be reversed, for example, in a nickel oxide material (e.g., NiO:CO) and/or bismuth oxide material (e.g., BiO:CO) and/or bismuth selenide material (e.g. $Bi_2S_3$), thereby permitting the nickel oxide material and/or bismuth oxide material to switch to exhibiting a substantially dissimilar impedance property, such as a high-impedance and/or insulative property, during device operation.

Thus, in this context, an electron back-donating material may comprise a material that exhibits an impedance switching property, such as switching from a first impedance state to a substantially dissimilar second impedance state (e.g., from a relatively low impedance state to a relatively high impedance state, or vice versa) based, at least in part, on influence of an applied voltage to control donation of electrons, and reversal of the electron donation, to and from a conduction band of the CEM.

In some embodiments, by way of back-donation, a CEM switch comprising a transition metal, transition metal compound, or a transition metal oxide, may exhibit low-impedance and/or conductive properties if the transition metal, such as nickel, for example, is placed into an oxidation state of 2+ (e.g., $Ni^{2+}$ in a material, such as NiO:CO). Conversely, electron back-donation may be reversed if a transition metal, such as nickel, for example, is placed into an oxidation state of 1+ or 3+. Accordingly, during operation of a CEM device, back-donation may result in "disproportionation," which may comprise substantially simultaneous oxidation and reduction reactions, substantially in accordance with expression (4), below:

$$2Ni^{2+} \rightarrow Ni^{1+} + Ni^{3+} \quad (4)$$

Such disproportionation, in this instance, refers to formation of nickel ions as $Ni_{1+}$ and $Ni^{3+}$ as shown in expression (4), which may bring about, for example, a relatively high-impedance and/or insulative state during operation of the CEM device. In an embodiment, a dopant such as a carbon-containing ligand, such as carbonyl (CO), may permit sharing of electrons during operation of a CEM device so as to give rise to the disproportionation reaction of expression (4), and its reversal, substantially in accordance with expression (5), below:

$$Ni^{1+} + Ni^{3+} \rightarrow 2Ni^{2+} \quad (5)$$

As previously mentioned, reversal of the disproportionation reaction, as shown in expression (5), may permit nickel-based CEM to return to a relatively low-impedance and/or conductive state.

Figure 2A:
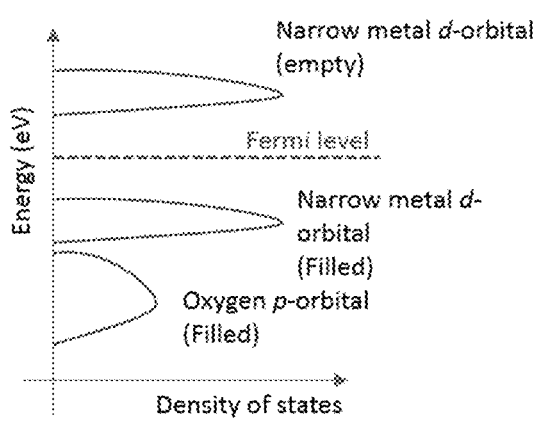
FIGS. 2A and 2B are example plots of energy versus density of states for two example transition metal oxide based insulators according to example embodiments.
Figure 2B:
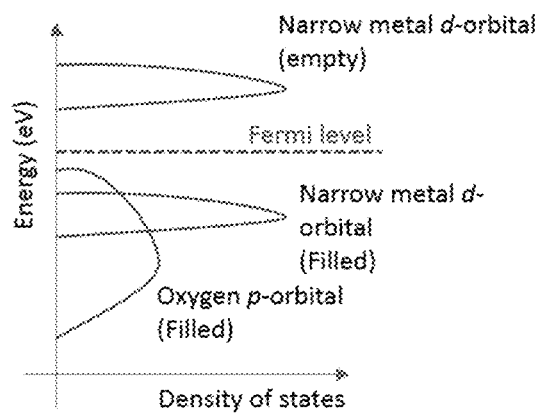
Figure 2C:
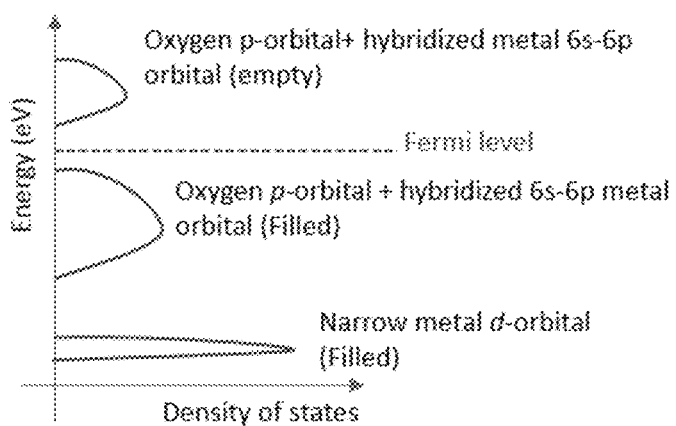
FIG. 2C is an example plot of energy versus density of states for a post transition metal based insulator according to an example embodiment.
Figure 2D:
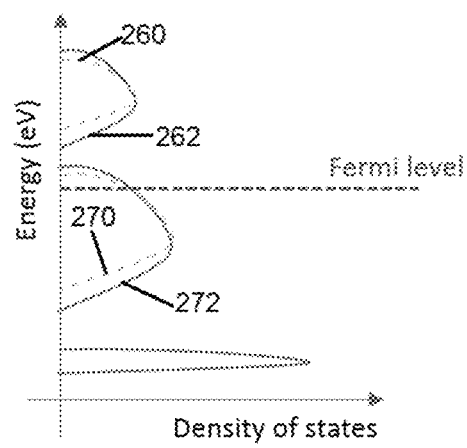
FIG. 2D is an example plot of energy versus density of states for a doped post transition metal based insulator according to an example embodiment.

In some embodiments, by way of back-donation, a CEM switch comprising a post transition metal, post transition metal compound, or a post transition metal oxide, may exhibit low-impedance and/or conductive properties if the post transition metal, such as Bi forms a π back bond with an extrinsic ligand such as CO. A π back bonding may be enabled by hybridization between the p-orbitals of the extrinsic ligand such as CO and the s- and p-orbital of the metal ion such as Bi. This hybridization modulates the band gap of the CEM inducing a p-type behavior for example as shown in FIG. 2D. A "potential well" formed by the metal-ligand complex controls the electron correlation. In a born-on and/or low impedance state this potential may be screened by an excess electrons resulting in reduced electron correlation. Extraction of electrons from CEM in a low impedance and/or a conductive state may reduce a screening of a "potential well" of the metal ion and ligand complex. This may increase electron correlation and splitting of a band gap, transitioning CEM to a high impedance and/or conductive state.

According to an embodiment, in a CEM device formed from a bulk TMO material, switching (e.g., between a high impedance and/or insulative state and a low impedance and/or conductive state) may occur responsive to strongly localized interaction in narrow d-orbitals and/or f-orbitals of a transition metal (e.g., Ni) forming a bulk TMO material. As pointed out above, this condition in a bulk TMO material may be facilitated by introduction of an extrinsic ligand (e.g., by application of a dopant) to bring about back-donation from metal atoms to unoccupied π-antibonding orbitals on the extrinsic ligand.

Two example types of TMO insulators may comprise Mott-Hubbard insulators and charge-transfer insulators. FIGS. 2A and 2B are example plots of energy versus density of states for an example Mott-Hubbard insulator (e.g., TiO) and an example charge-transfer insulator (e.g., NiO), respectively. As may be observed in the presently illustrated example insulators, a conduction band above a Fermi level comprises metal atoms with at least partially empty d-orbitals while a valence band below a Fermi level comprises metal atoms with filled d-orbitals. FIGS. 2C and 2D are example plots of energy versus density of states of example PTMO insulators with conduction and valence band comprising hybridized p-orbital from a ligand and s- and p-orbital from a metal ion. In embodiments presently illustrated in FIGS. 2A through 2D, a conduction band may comprise an upper Hubbard band while a valence band may comprise a lower Hubbard band. Accordingly, "conduction band" as referred to in reference to FIGS. 2A through 2D herein may be interchangeable with "upper Hubbard band." Likewise, "valence band" as referred to in reference to FIGS. 2A through 2D herein may be interchangeable with "lower Hubbard band."

As pointed out above, CEMs are not limited to TMOs but may include other materials having properties and/or behavior of CEMs including, but not limited to, PTMOs and PTMCs. According to an embodiment, a CEM device formed from a bulk PTMO and/or PTMC material may be made to have switching behavior similar to that of a CEM formed from a bulk TMO material. However, a CEM device formed from a bulk PTMO and/or PTMC a post transition metal compound may comprise a post transition metal and/or post transmission metal compound in which d- and f-orbitals of a metal ion are completely filled, and s-orbitals of a metal ion form hybrid orbitals with p-orbitals of oxygen or a chalcogenide. In this context, hybrid or hybridized orbitals referred to herein mean a mixing atomic orbital into new hybrid orbitals having a different energy than at least one component atomic orbital of the mixed atomic orbitals. (with different energies, shapes, etc., than the component atomic orbitals) suitable for the pairing of electrons to form chemical bonds.

FIG. 2C is an example plot of energy versus density of states for an example PTMO (e.g., BiO). As may be observed in the presently illustrated example PTMO based insulator, a conduction band above a Fermi level comprises oxygen p-orbitals hybridized with metal s- and p-orbitals, and a valence band below the Fermi level comprises a hybridization of oxygen p-orbitals with metal s- and p-orbitals.

According to an embodiment, a PTMO insulator (e.g., $Bi_2O_3$) may be doped with one or more ligands (e.g., C, CO and/or other extrinsic ligands) to impart properties of a CEM material capable of exhibiting switching behavior in a device. According to an embodiment, an extrinsic ligand (e.g., C and/or CO applied as a dopant) may be introduced to a PTMO (e.g., $Bi_2O_3$ and/or other PTMO) to allow the extrinsic ligand to hybridize with s- and p-orbitals of a post transition metal (e.g., displacing oxygen in hybridized orbital). According to an embodiment, application of such an extrinsic ligand to a PTMO may alter an energy versus density of states profile as illustrated in FIG. 2C in which a conduction band 260 is widened to a conduction band 262, a valence band 270 is expanded to a valence band 272, and a Fermi level is lowered into valence band 272. As may be observed, application of an extrinsic ligand to a PTMO may decrease a bandgap as there is less separation between conduction band 262 and valence band 272 than between conduction band 260 and valence band 270, which may be sufficient to transition a PTMO from an insulative material to a p-type material. In a particular implementation, a bandgap (e.g., between conduction band 262 and valence band 272) may be modulated based, at least in part, on an amount of an extrinsic ligand (e.g., CO applied as a dopant). It may also be observed that back-donation and injected charge from application of an extrinsic ligand to a PTMO may also affect a local electronegativity $\chi$, which may be related to a bandgap $E_G$ (e.g., separation between bottom of the conduction band 262 and top of the valence band 272) as $E_G \propto \chi$. In an embodiment, an extrinsic ligand to a PTMO and/or PTMC may form hybridized bonds with s- and p-orbitals of the metal ions to at least in part displace oxygen or a chalcogen in hybridized bonds with s- and p-orbitals of the metal ions as illustrated in FIG. 2D. In an implementation of a process to form a CEM, a predefined bandgap between conduction and valence bands or a predefined electronegativity in the correlated electron material, or a combination thereof, may be achieved responsive at least in part to a degree that an extrinsic ligand displaces oxygen or a chalcogen in hybridized bonds with s- and p-orbitals of a metal ion. For example, an amount of an extrinsic ligand permitted to displace oxygen or a chalcogenide in hybridized bonds with s- and p-orbitals of metal ions may be controlled to achieve a desired or predefined bandgap between conduction and valence bands and/or a desired or predefined electronegativity in a correlated electron material.

In an operational CEM device, according to an embodiment as shown in FIG. 2C, holes may be injected (e.g., at a positive electrode of the device) or electrons may be extracted to an upper portion of a valence band. A reduced electron density may inhibit screening to increase and/or widen a bandgap, placing such an operational device in a high impedance and/or insulative state (e.g., as in a RESET operation). Holes at an upper portion of a valence band (e.g., near a bandgap) may be filled by injection of electrons to increase screening and close the bandgap, thereby placing such an operational CEM device in a low impedance and/or conductive state (e.g., as in a SET operation).

Figure 3A:
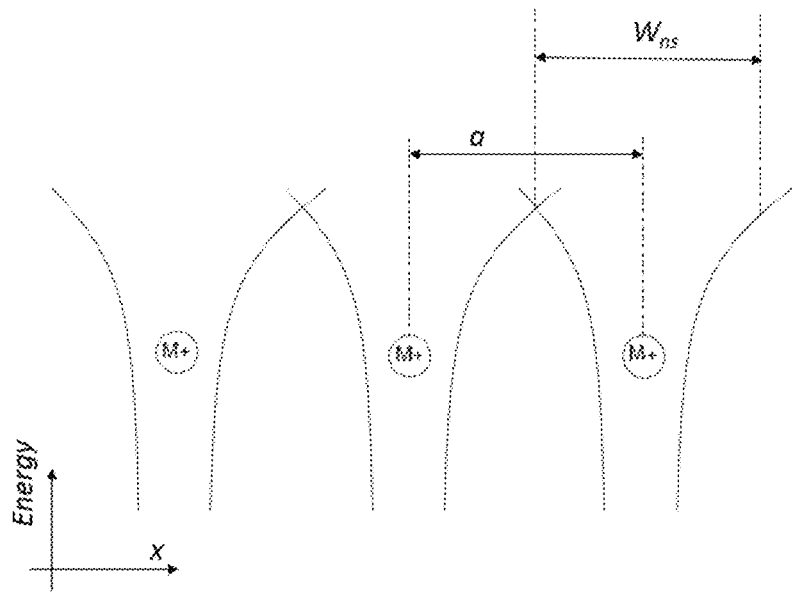
FIG. 3A is an example plot of energy versus distance from metal ions for an example post transition metal oxide with electrons in a relatively unscreened state according to an embodiment.
Figure 3B:
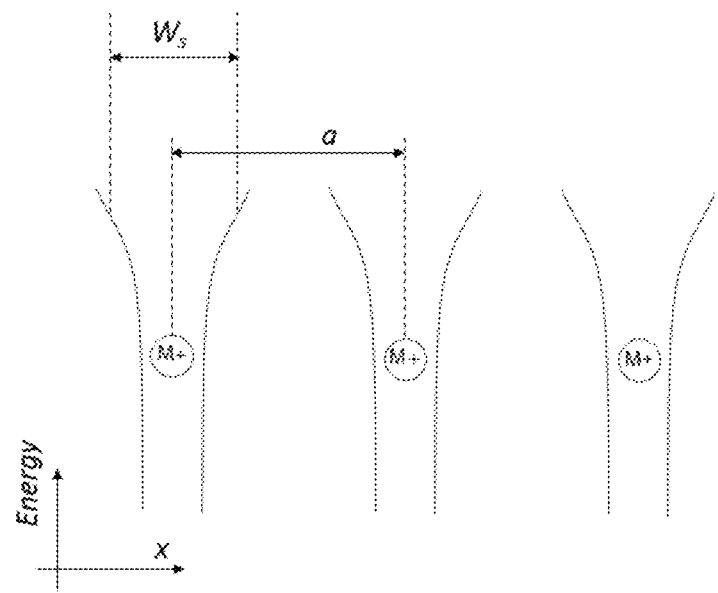
FIG. 3B is an example plot of energy versus distance from metal ions for an example post transition metal oxide with electrons in a relatively screened state according to an embodiment.

In addition to reducing a bandgap in a PTMO, application of an extrinsic ligand may also affect a level of screening by electrons in the PTMO as illustrated in FIGS. 3A and 3B, wherein FIGS. 3A and 3B illustrate example levels of electron screening in an undoped PTMO and a doped PTMO (e.g., application of an extrinsic ligand to hybridize with metal s- and p-orbitals), respectively. An addition of electrons from application of a dopant may change inter-atomic interactions. Carriers may affect a potential in proximity to metal ions M+ and an increased screening may enable switching behavior. Here, it may be observed that doping may not significantly affect a distance between metal ions M+ in a crystal structure (e.g., as indicated by lattice constant $\alpha$). Nevertheless, an effective width of a potential in proximity to metal ions M+ may change from $W_{ns}$ as shown in FIG. 3A to $W_s$ as shown in FIG. 3B.

According to an embodiment, a CEM may be formed from doping an example PTMO (e.g., $Bi_2O_3$) with a controlled amount of a carbon-containing dopant (e.g., C and/or CO) to provide suitable variable impedance characteristics (e.g., through back-donation). As shown in the particular example of expression (6), $Bi_2O_3$ (e.g., in a solid state) may be doped with carbon (e.g., in a solid state) to reduce $Bi_2O_3$ to 2Bi provide a by-product 3CO (e.g., in gas state).

$$Bi_2O_3 + 3C \rightarrow 2Bi + 3CO \tag{6}$$

According to an embodiment, reactions as per expressions (6) and/or (7) may occur in the presence a high concentration of $CO_2$ in an ambient gas while temperature of doped material is elevated (e.g., 200 to 400° C.) to, among other things, facilitate formation of CO according to expression (6) and suppress degassing from escape of $CO_2$ from doped material. In an implementation, 2Bi produced in a reaction according to expression (6) may be oxidized by $3CO_2$ to convert 2Bi to $Bi_2O_3$ and produce an additional 3CO according to expression (7) as follows:

$$2Bi + 3CO_2 \rightarrow Bi_2O_3 + 3CO \tag{7}$$

In an embodiment, reactions of expressions (6) and (7) may occur simultaneously during an annealing process. Amounts of CO produced in reactions of expressions (6) and (7) and/or amounts of CO introduced as a dopant (e.g., in addition to amounts of C introduced as a dopant) may be maintained in a resulting lattice. It may be further observed that under certain conditions (e.g., annealing temperatures) that Bi (as produced in a reaction according to expression (6)) may readily diffuse through a material to freely react with $CO_2$ according to expression (7). According to an embodiment, Bi (as produced in a reaction according to expression (6)) may also readily diffuse through a material to freely react an $O_2$ gas (e.g., in vacancies in a material). For example, amounts of solid Bi produced by a reduction according to expression (6) may serve to reduce any $O_2$ vacancies in an oxidation reaction according to expression (8) as follows:

$$4Bi + 3O_2 \rightarrow 2Bi_2O_3 \tag{8}$$

According to an embodiment of reactions of expressions (6), (7) and/or (8), amounts of C and/or CO applied as a dopant to $Bi_2O_3$ in formation of CEM may be varied to control, for example, an atomic concentration of CO to be maintained and/or disposed in a lattice as well as a degree of removal of any $O_2$ vacancies. According to an embodiment, CO may be disposed in a lattice and maintained in place by $\pi$-back bonding to metal ion in $Bi_2O_3$ (e.g., provided in host material and/or outputs of reactions of expressions (7) and/or (8)) as discussed above. A CO ligand (or other substitutional ligand) may be similarly maintained in place in lattices formed by PTMCs and other PTMOs by, for example, $\pi$-back bonding to metal ions in PTMO and/or PTMC host material.

According to an embodiment, a local back-donation to $Bi_2O_3$ from application of a carbon and/or CO dopant may affect electronegativity, enabling a lowering of a Fermi level into a valence band. In an embodiment, a CO dopant applied to $Bi_2O_3$ may provide band filling to enable switching behavior. For example, $\pi$-back-donation may adjust electronegativity and enable and/or encourage $\sigma$-bonds. Given a particular concentration of CO dopant, electronegativity may be represented as and/or expressed as Thomas Fermi screening length $\lambda_{TF} \propto 1/\sqrt{n}$, where n is a concentration of electrons.

According to an embodiment, and as pointed out above, oxygen in a PTMO or a chalcogen in a PTMC may provide an intrinsic ligand to at least partially contribute to an electron density. However, a p-orbital of an intrinsic ligand (e.g., oxygen in a PTMO or chalcogen in a PTMC) has shown to contribute to lower portions of a valence band and little to upper portions of a valence band (e.g., close to a Fermi level).

In the case of oxides of lighter Period 5 based post transition metals (e.g., CdO, $In_2O_3$ and $SnO_2$), hybridization of 6s and 6p orbitals of a metal may be limited to hybridization with metal ions, resulting in a metal "lone pair." In the case of heavier Period 6 based PTMOs (e.g., $Bi_2O_3$, $PbO_2$, PbO, HgO and $Td_2O_3$) 6s and 6p orbitals may hybridize with an intrinsic ligand. In the particular case of $Bi_2O_3$ discussed above, for example, O 2p states may hybridize with 6s and 6p orbitals of metal at an upper portion of a valence band. As such, heavier Period 6 based PTMOs may provide larger bandgaps, which may be suitable candidates for bandgap modulation though doping as discussed above.

In addition, $3d^{10}$ orbitals of metals in oxides of heavier Period 6 based PTMOs may prevent and/or inhibit screening at a nucleus (core) while hybridization may maintain charge neutrality locally. Here, application of a carbon containing dopant (e.g., C and/or CO) may enable back-donation to lower a central ion electronegativity, reducing bandgap and alter an interaction between O 2p orbitals with 6s-6p metal orbitals to enable hybridization of O 2p orbitals and 6s-6p metal orbitals. In an embodiment, carbon and/or CO applied as a dopant may replace oxygen in hybridized orbitals with metal 6s-6p orbitals at an upper portion of a valence band, thereby reducing bandgap and lowering a Fermi level into the valence band.

In particular embodiments discussed above, a CEM may be formed from doping a Period 5 post transition metal oxide (e.g., CdO, $In_2O_3$ and/or $SnO_2$) and/or a Period 6 post transition metal oxide (e.g., $Bi_2O_3$, $PbO_2$, PbO, HgO and/or $Td_2O_3$). In other particular embodiments, a CEM may be formed from a Period 4 transition metal oxide (e.g., ZnO and/or $Ga_2O_3$). As discussed above, any PTMO from among the aforementioned Period 4, 5 or 6 Period post transition metals may comprise a metal s- and p-orbitals hybridized with oxygen p-orbital in a conduction band, and oxygen p-orbital hybridized with metal s- and p-orbitals in a valence band, with a Fermi level located in bandgap between conduction and valence bands. Application of a dopant (e.g., CO) may allow an extrinsic ligand to hybridize with s- and p-orbitals of a post transition metal. According to an embodiment, application of such an extrinsic ligand to a PTMO may alter an energy versus density of states profile in which a conduction band and a valence band are widened (or narrowed or displaced), and a Fermi level is lowered into the valence band by hole doping. As may be observed, application of an extrinsic ligand to a PTMO may lower a bandgap as there is less separation between conduction and valence bands, which may be sufficient to transition a PTMO from an insulative material to a p-type material. In a particular implementation, a bandgap in a PTMO may be similarly modulated based, at least in part, on an amount of an extrinsic ligand (e.g., CO applied as a dopant).

Particular examples of a post transition metal based CEM discussed above are directed to CEMs formed from one or more PTMOs. As pointed out above, a CEM may also be formed from one or more PTMCs. Here, a chalcogen (e.g., S, Se, Te and/or Po) in a PTMC may function as an intrinsic ligand (e.g., having p-orbitals of a chalcogenide hybridize with 6s-6p orbitals of a metal ion) like oxygen in a PTMO. Particular examples of a PTMC may include, for example, a PTMC formed from Period 4 post transition metals (e.g., Zn and/or Ga), Period 5 post transition metals (e.g., Cd, In, Sn and/or Sb) or Period 6 post transition metals (Bi, Pb, Hg and/or Td). For example, a PTMC (e.g., post transition metal sulfide, selenide, telluride and/or polonide) may comprise a metal p- and s-orbitals and chalcogen p-orbital in a conduction band, and chalcogen p-orbital hybridized with metal s- and p-orbitals in a valence band, with a Fermi level located in the bandgap between conduction and valence bands. Application of a dopant (e.g., C and/or CO) may allow an extrinsic ligand to hybridize with s- and p-orbitals of a post transition metal ion (e.g., displacing a chalcogenide as a ligand to hybridize with s- and p-orbitals of a post transition metal ion). According to an embodiment, application of such an extrinsic ligand to a PTMC may alter an energy versus density of states profile in which a conduction band and a valence band are widened (or narrowed or displaced to another energy), and a Fermi level is lowered into the valence band. As may be observed, application of an extrinsic ligand to a PTMC may reduce a bandgap as there is less separation between conduction and valence bands, which may be sufficient to transition a PTMC from an insulative material to a p-type material. In a particular implementation, as in the case of a PTMO, a bandgap in a PTMC may be similarly modulated based, at least in part, on an amount of an extrinsic ligand (e.g., C and/or CO applied as a dopant).

In one particular implementation, a bulk material forming a CEM device may comprise a CEM compound of a PTMO and/or PTMC formed from a Period 6 post transition metal (e.g., Bi, Pb, Hg and/or Td) combined with a PTMO and/or PTMC formed from a Period 5 post transition metal (e.g., Cd, In, Sn and/or Sb). In another particular implementation, a bulk material forming a CEM device may comprise a CEM compound of a PTMO and/or PTMC formed from a Period 6 post transition metal combined with a PTMO and/or PTMC formed from a Period 4 post transition metal (e.g., Zn and/or Ga). In another particular implementation, a bulk material forming a CEM device may comprise a CEM compound of a PTMO and/or PTMC formed from a Period 6 post transition metal combined with a PTMO and/or PTMC formed from a Period 5 post transition metal, and further combined with a PTMO and/or PTMC formed from PTMO and/or PTMC formed from a Period 4 post transition metal.

In certain embodiments, atomic layer deposition may be utilized to form or to fabricate films comprising NiO materials, such as NiO:CO, and/or BiO materials, such as BiO:CO. In this context, a "layer" as the term is used herein means a sheet or coating of material, which may be disposed on or over an underlying formation, such as a conductive or insulating substrate. For example, a layer deposited on an underlying substrate by way of an atomic layer deposition process may comprise a thickness dimension comparable to that of a single atom, which may comprise, for example, a fraction of an angstrom (e.g., 0.3 Å). However, in other embodiments, a layer may encompass a sheet or coating comprising a thickness dimension greater than that of a single atom depending, for example, on a process utilized to fabricate films comprising a CEM film. Additionally, a "layer" may be oriented horizontally (e.g. a "horizontal" layer), oriented vertically (e.g., a "vertical" layer), or may be positioned in any other orientation, such as diagonally, for example. In embodiments, a CEM film may comprise a sufficient number of layers, to permit electron back-donation during operation of a CEM device in a circuit environment, for example, to give rise to a low-impedance/conductive state. Also during operation in a circuit environment, for example, electron back-donation may be reversed so as to give rise to a substantially dissimilar impedance state, such as a high-impedance/insulative state, for example.

Also in this context, a "substrate" as used herein means a structure comprising a surface that enables materials, such as materials having particular electrical properties (e.g., conductive properties, insulative properties, etc.) to be deposited or placed on or over the substrate. For example, in a CEM-based device, a conductive substrate may operate in a manner similar to first conductor 160 to convey an electrical current to a CEM film in contact with conductive substrate 160. In another example, a substrate may operate to insulate a CEM film to prohibit electrical current flow to or from the CEM film. In one possible example of an insulating substrate, a material such as silicon nitride (SiN) may be employed to insulate components of semiconductor structures. Further, an insulating substrate may comprise other silicon-based materials such as silicon-on-insulator (SOI) or silicon-on-sapphire (SOS) technology, doped and/or undoped semiconductors, epitaxial layers of silicon supported by a base semiconductor foundation, conventional metal oxide semiconductors (CMOS), e.g., a CMOS front end with a metal back end, and/or other semiconductor structures and/or technologies, including CES devices, for example. Accordingly, claimed subject matter is intended to embrace a wide variety of conductive and insulating substrates without limitation.

In particular embodiments, formation of CEM films on or over a substrate may utilize two or more precursors to deposit components of, for example, NiO:CO, or other transition metal oxide, transition metal, post transition metal, post transition metal oxide or post transition metal chalcogenide, or combination thereof, onto a conductive material such as a substrate. In an embodiment, layers of a CEM film may be deposited utilizing separate precursor molecules, AX and BY, according to expression (9), below:

$$AX + BY \rightarrow AB_{(solid)} + XY \qquad (9)$$

Wherein "A" of expression (6A) corresponds to a transition metal, transition metal compound, transition metal oxide, post transition metal, post transition metal oxide or post transition metal chalcogenide, or any combination thereof. In embodiments, a transition metal oxide may comprise nickel, but may comprise other transition metals, transition metal compounds, and/or transition metal oxides, such as aluminum, cadmium, chromium, cobalt, copper, gold, iron, manganese, mercury, molybdenum, nickel palladium, rhenium, ruthenium, silver, tantalum, tin, titanium, vanadium, yttrium, and zinc (which may be linked to an anion, such as oxygen or other types of ligands), or combinations thereof, although claimed subject matter is not limited in scope in this respect. In particular embodiments, compounds that comprise more than one transition metal oxide may also be utilized, such as yttrium titanate ($YTiO_3$).

In embodiments, "X" of expression (9) may comprise a ligand, such as organic ligand, comprising amidinate (AMD), dicyclopentadienyl $(Cp)_2$, diethylcyclopentadienyl $(EtCp)_2$, Bis(2,2,6,6-tetramethylheptane-3,5-dionato) $((thd)_2)$, acetylacetonate (acac), bis(methylcyclopentadienyl) $((CH_3C_5H_4)_2)$, dimethylglyoximate $(dmg)_2$, 2-amino-pent-2-en-4-onato $(apo)_2$, $(dmamb)_2$ where dmamb=1-dimethylamino-2-methyl-2-butanolate, (dmamp)2 where dmamp=1-dimethylamino-2-methyl-2-propanolate, Bis(pentamethylcyclopentadienyl) $(C_5(CH_3)_5)_2$ and carbonyl $(CO)_4$. Accordingly, in some embodiments, nickel-based precursor AX may comprise, for example, nickel amidinate (Ni(AMD)), nickel dicyclopentadienyl $(Ni(Cp)_2)$, nickel diethylcyclopentadienyl $(Ni(EtCp)_2)$, Bis(2,2,6,6-tetramethylheptane-3,5-dionato)Ni(II) $(Ni(thd)_2)$, nickel acetylacetonate $(Ni(acac)_2)$, bis(methylcyclopentadienyl)nickel $(Ni(CH_3C_5H4)_2)$, Nickel dimethylglyoximate $(Ni(dmg)_2)$, nickel 2-amino-pent-2-en-4-onato $(Ni(apo)_2)$, $Ni(dmamb)_2$ where dmamb=1-dimethylamino-2-methyl-2-butanolate, $Ni(dmamp)_2$ where dmamp=1-dimethylamino-2-methyl-2-propanolate, Bis(pentamethylcyclopentadienyl) nickel $(Ni(C_5(CH_3)_5)_2$, and nickel carbonyl $(Ni(CO)_4)$, just to name a few examples.

However, in particular embodiments, a dopant operating as an electron back-donating species in addition to precursors AX and BY may be utilized to form layers of a TMO, PTMO and/or PTMC film. An electron back-donating species, which may co-flow with precursor AX, may permit formation of electron back-donating compounds, substantially in accordance with expression (9), above. In embodiments, a dopant species or a precursor to a dopant species, such as carbonyl $(CO)_4$, methane $(CH_4)$, carbon monoxide (CO), or other precursors and/or dopant species may be utilized to provide electron back-donating ligands listed above. It should be noted that concentrations, such as atomic concentrations, of precursors, such as AX, BY of expressions (9) may be adjusted to give rise to a final atomic concentration of carbon-containing dopant to permit electron back-donation in a fabricated CEM device. As referred to herein, the term "atomic concentration" means a ratio of a number of atoms of to a total number of atoms in a material. In particular, a "dopant atomic concentration" as referred to herein means a ratio of atoms in a finished material that derive from a substitutional ligand. For example, in the case in which a substitutional ligand comprises CO, a dopant atomic concentration of CO may comprise a total number of carbon atoms that make up a material film divided by a total number of atoms in the material film.

Reaction according to expressions (9) may be carried out as one or more aspects of a deposition technique such as, for example, atomic layer deposition, chemical vapor deposition, plasma chemical vapor deposition, sputter deposition, physical vapor deposition, hot wire chemical vapor deposition, laser enhanced chemical vapor deposition, laser enhanced atomic layer deposition, rapid thermal chemical vapor deposition, spin on deposition, gas cluster ion beam deposition, or the like, utilized in fabrication of CEM devices from TMO, PTMO and/or PTMC host materials. As such, precursors AX and/or BY may comprise a solid or gas state. In particular embodiments, application of nitrogen- or carbon-containing dopants may comprise carbon, carbonyl (CO) (e.g., as precursor in a reaction according to expression (9)) may impart an atomic concentration of an extrinsic and/or substitutional ligand between about 0.1% and about 20.0%. In particular embodiments, atomic concentrations of extrinsic ligands, such as from application of dopants comprising C and/or CO, may comprise a more limited range of atomic concentrations such as, for example, between about 1.0% and about 20.0%. However, claimed subject matter is not necessarily limited to the above-identified precursors and/or atomic concentrations, and that claimed subject matter is intended to embrace all such precursors and atomic concentrations of substitutional and/or extrinsic ligands imparted from dopants to be utilized in deposition techniques to form CEM from TMO, PTMO and/or PTMC host materials. In expressions (9), "BY" may comprise an oxidizer, such as water $(H_2O)$, oxygen $(O_2)$, ozone $(O_3)$, plasma $O_2$, hydrogen peroxide $(H_2O_2)$. In other embodiments, "BY" may comprise CO, $O_2+(CH_4)$, or carbon-containing a gaseous oxidizing agent. In other embodiments, plasma may be used with an oxidizer (BY) to form oxygen radicals (O*). Likewise, plasma may be used with a dopant species to form an activated species to control concentration of an extrinsic and/or substitutional ligand in a CEM.

In certain embodiments, a single two-precursor cycle (e.g., AX and BY, as described with reference to expression (9) utilizing atomic layer deposition may bring about a layer of a TMO, PTMO and/or PTMC material film comprising a thickness dimension approximately in the range of 0.3 Å to 5.0 Å per cycle). Accordingly, in one embodiment, if an atomic layer deposition process is capable of depositing layers of a TMO material, PTMO and/or PTMC film comprising a thickness dimension of approximately 0.3 Å, 800-900 two-precursor cycles may be utilized to bring about a TMO, PTMO and/or PTMC material film comprising a thickness dimension of approximately 500.0 Å. It should be noted that atomic layer deposition may be utilized to form TMO, PTMO and/or PTMC material films having other thickness dimensions, such as thickness dimensions approximately in the range of about 15.0 Å to about 1500.0 Å, for example, and claimed subject matter is not limited in this respect.

In particular embodiments, responsive to one or more two-precursor cycles (e.g., AX and BY), or three-precursor cycles (AX, $CH_4$, or other ligand comprising nitrogen, carbon or other back-donating dopant material and BY), of atomic layer deposition, a TMO, PTMO and/or PTMC material film may be exposed to elevated temperatures, which may, at least in part, enable formation of a CEM device from a TMO, PTMO and/or PTMC material film. Exposure of the TMO, PTMO and/or PTMC material film to an elevated temperature may additionally enable activation of a back-donating dopant derived from a ligand, such as in the form of carbon, carbon monoxide, carbonyl, responsive to repositioning of the dopant to metal oxide lattice structures of the CEM device film.

Thus, in this context, an "elevated temperature" means a temperature at which substitutional or substitutional ligands evaporate from a TMO, PTMO and/or PTMC material film, and/or are repositioned within a TMO, PTMO and/or PTMC material film, to such an extent that the TMO, PTMO and/or PTMC material film transitions from a resistive film to a film that is capable of switching between a relatively high-impedance and/or insulative state to a relatively low-impedance and/or conductive state. For example, in certain embodiments, a TMO, PTMO and/or PTMC material film exposed to an elevated temperature within a chamber of about 100.0° C. to about 800.0° C. for a duration of about 30.0 seconds to about 120.0 minutes may permit evaporation of substitutional ligands from the TMO, PTMO and/or PTMC material film so as to form a CEM film. Additionally, in certain embodiments, a TMO, PTMO and/or PTMC material film exposed to an elevated temperature within a chamber of about 100.0° C. to about 800.0° C. for a duration of about 30.0 seconds to about 120.0 minutes may permit repositioning of substitutional ligands, for example, at oxygen vacancies within a lattice structure of a metal oxide. In particular embodiments, elevated temperatures and exposure durations may comprise more narrow ranges, such as, for example, temperatures of about 200.0° C. to about 500.0° C. for about 1.0 minute to about 60.0 minutes, for example, and claimed subject matter is not limited in these respects.

In particular embodiments, a CEM device manufactured in accordance with the above-described process may exhibit a "born on" property in which the device exhibits relatively low impedance (relatively high conductivity) immediately after fabrication of the device. Accordingly, if a CEM device is integrated into a larger electronics environment, for example, at initial activation a relatively small voltage applied to a CEM device may permit a relatively high current flow through the CEM device, as shown by region 104 of FIG. 1A. For example, as previously described herein, in at least one possible embodiment, $V_{reset}$ may occur at a voltage approximately in the range of about 0.1 V to about 1.0 V, and $V_{set}$ may occur at a voltage approximately in the range of about 1.0 V to about 2.0 V, for example. Accordingly, electrical switching voltages operating in a range of about 2.0 V, or less, may permit a memory circuit, for example, to write to a CERAM memory device, to read from a CERAM memory device, or to change state of a CERAM switch, for example. In embodiments, such relatively low voltage operation may reduce complexity, cost, and may provide other advantages over competing memory and/or switching device technologies.

Also in this context, a "level" as the term is used herein, means a discrete surface, which a conductive metal layer may traverse, wherein the discrete surface is separated from discrete surfaces immediately above and/or immediately below, by an insulating material. For example, as described herein, a conductive metal layer traversing a first level may be separated from a conductive metal layer traversing a second level by an insulating material, such as silicon nitride. In this context, a "multi-level" switching device, as the term is used herein, means a device to perform a switching function, such as from a high-impedance/insulative state to a low-impedance state, utilizing two or more of the above-described "levels."

As described herein, responsive to depositing one or more dopant layers on or over one or more layers of a first material, such as a transition metal, a transition metal oxide, a transition metal compound or alloy, dopant concentration of a CEM may be accurately controlled. Additionally, by depositing one or more dopant layers on or over one or more layers of a first material, localized regions of CEM may comprise differing atomic concentrations of dopants so as to provide an approach toward tailoring or customizing a dopant concentration profile. Further, dopant concentration profiles within a CEM may be increased via adjusting annealing temperatures and/or annealing durations. In addition to the above-identified advantages, particular embodiments may provide an approach toward fabricating or forming a common source electrode, which may be useful in fabricating three-dimensional structures utilized for NAND flash memory. However, claimed subject matter is not limited to the above-identified advantages.

Figure 4:
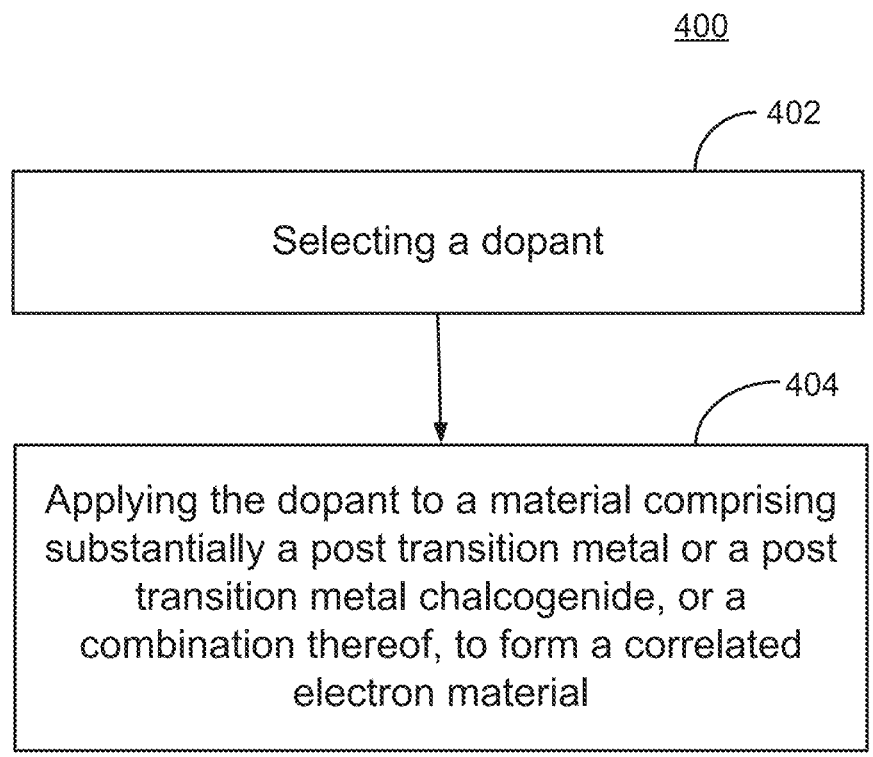
FIG. 4 is a flow diagram of an example process for forming a correlated electron material (CEM) according to an embodiment.

FIG. 4 is a flow diagram of a process 400 to form a CEM, such as in a CEM device, according to an embodiment. Block 402 may comprise a selection of a dopant such as, for example, a type of dopant (e.g., CO and/or C) and an amount of dopant. Block 404 may comprise application of the dopant selected at block 402 to a post transition metal oxide or a post transition metal chalcogenide, or a combination thereof, to form a CEM. In a particular implementation, block 404 may apply a dopant selected in block 402 in the course of depositing one or more layers of a CEM as described above with reference to expressions in 9.

According to an embodiment, p-orbitals of oxygen ions of a PTMO form a hybridized orbital with s- and p-orbitals of metal ions of the PTMO in a valence band. Likewise, p-orbitals of chalcogenide ions of a PTMC form a hybridized orbital with s- and p-orbitals of metal ions of the PTMC in a valence band. In a particular implementation, a dopant applied at block 402 may provide a ligand to displace hybridized orbitals of oxygen and/or chalcogenide such that p-orbitals of a ligand forms hybridized orbitals with s- and p-orbitals of metal ions. Such a displacement of hybridized orbitals with oxygen and/or chalcogenide may reduce a bandgap, making a resulting CEM more p-type as discussed above. In an embodiment, block 402 may comprise selecting a particular amount of dopant(s) to be applied to a PTMO and/or PTMC so as to achieve a predefined electronegativity in CEM or a predefined band gap between conductive and valence bands of CEM, or a combination thereof.

In one particular implementation, block 404 may comprise application of a dopant comprising C and/or CO to a PTMO comprising $Bi_2O_3$ according to expressions (6), (7) and (8) discussed above in which $Bi_2O_3$ may be reduced to form CO gas and Bi solid, and oxidation of Bi solid by $CO_2$ to produce additional CO gas. Here, block 402 may comprise varying amounts of C and/or CO selected as dopant(s) so as to control a removal of O vacancies in CEM and an amount of CO gas to be maintained in a lattice comprising $Bi_2O_3$.

According to an embodiment, block 404 may comprise formation of one or more layers of CEM over a substrate and/or between metal layers forming a device. For example, block 404 may comprise forming one or more layers of CEM to provide a CEM film 170 between conductive substrate 160 and conductive overlay 180 shown in FIG. 1B.

In the preceding description, in a particular context of usage, such as a situation in which tangible components (and/or similarly, tangible materials) are being discussed, a distinction exists between being "on" and being "over." As an example, deposition of a substance "on" a substrate refers to a deposition involving direct physical and tangible contact without an intermediary, such as an intermediary substance (e.g., an intermediary substance formed during an intervening process operation), between the substance deposited and the substrate in this latter example; nonetheless, deposition "over" a substrate, while understood to potentially include deposition "on" a substrate (since being "on" may also accurately be described as being "over"), is understood to include a situation in which one or more intermediaries, such as one or more intermediary substances, are present between the substance deposited and the substrate so that the substance deposited is not necessarily in direct physical and tangible contact with the substrate.

A similar distinction is made in an appropriate particular context of usage, such as in which tangible materials and/or tangible components are discussed, between being "beneath" and being "under." While "beneath," in such a particular context of usage, is intended to necessarily imply physical and tangible contact (similar to "on," as just described), "under" potentially includes a situation in which there is direct physical and tangible contact but does not necessarily imply direct physical and tangible contact, such as if one or more intermediaries, such as one or more intermediary substances, are present. Thus, "on" is understood to mean "immediately over" and "beneath" is understood to mean "immediately under."

It is likewise appreciated that terms such as "over" and "under" are understood in a similar manner as the terms "up," "down," "top," "bottom," and so on, previously mentioned. These terms may be used to facilitate discussion but are not intended to necessarily restrict scope of claimed subject matter. For example, the term "over," as an example, is not meant to suggest that claim scope is limited to only situations in which an embodiment is right side up, such as in comparison with the embodiment being upside down, for example. An example includes a flip chip, as one illustration, in which, for example, orientation at various times (e.g., during fabrication) may not necessarily correspond to orientation of a final product. Thus, if an object, as an example, is within applicable claim scope in a particular orientation, such as upside down, as one example, likewise, it is intended that the latter also be interpreted to be included within applicable claim scope in another orientation, such as right side up, again, as an example, and vice-versa, even if applicable literal claim language has the potential to be interpreted otherwise. Of course, again, as always has been the case in the specification of a patent application, particular context of description and/or usage provides helpful guidance regarding reasonable inferences to be drawn.

Unless otherwise indicated, in the context of the present disclosure, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C; whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Furthermore, the terms "first," "second," "third," and the like are used to distinguish different aspects, such as different components, as one example, rather than supplying a numerical limit or suggesting a particular order, unless expressly indicated otherwise. Likewise, the term "based on" and/or similar terms are understood as not necessarily intending to convey an exhaustive list of factors, but to allow for existence of additional factors not necessarily expressly described.

Furthermore, it is intended, for a situation that relates to implementation of claimed subject matter and is subject to testing, measurement, and/or specification regarding degree, to be understood in the following manner. As an example, in a given situation, assume a value of a physical property is to be measured. If alternatively reasonable approaches to testing, measurement, and/or specification regarding degree, at least with respect to the property, continuing with the example, is reasonably likely to occur to one of ordinary skill, at least for implementation purposes, claimed subject matter is intended to cover those alternatively reasonable approaches unless otherwise expressly indicated. As an example, if a plot of measurements over a region is produced and implementation of claimed subject matter refers to employing a measurement of slope over the region, but a variety of reasonable and alternative techniques to estimate the slope over that region exist, claimed subject matter is intended to cover those reasonable alternative techniques, even if those reasonable alternative techniques do not provide identical values, identical measurements or identical results, unless otherwise expressly indicated.

It is further noted that the terms "type" and/or "like," if used, such as with a feature, structure, characteristic, and/or the like, using "optical" or "electrical" as simple examples, means at least partially of and/or relating to the feature, structure, characteristic, and/or the like in such a way that presence of minor variations, even variations that might otherwise not be considered fully consistent with the feature, structure, characteristic, and/or the like, do not in general prevent the feature, structure, characteristic, and/or the like from being of a "type" and/or being "like," (such as being an "optical-type" or being "optical-like," for example) if the minor variations are sufficiently minor so that the feature, structure, characteristic, and/or the like would still be considered to be predominantly present with such variations also present. Thus, continuing with this example, the terms optical-type and/or optical-like properties are necessarily intended to include optical properties. Likewise, the terms electrical-type and/or electrical-like properties, as another example, are necessarily intended to include electrical properties. It should be noted that the specification of the present disclosure merely provides one or more illustrative examples and claimed subject matter is intended to not be limited to one or more illustrative examples; however, again, as has always been the case with respect to the specification of a patent application, particular context of description and/or usage provides helpful guidance regarding reasonable inferences to be drawn.

In the preceding description, various aspects of claimed subject matter have been described. For purposes of explanation, specifics, such as amounts, systems, and/or configurations, as examples, were set forth. In other instances, well-known features were omitted and/or simplified so as not to obscure claimed subject matter. While certain features have been illustrated and/or described herein, many modifications, substitutions, changes, and/or equivalents will occur to those skilled in the art. It is, therefore, to be understood that the appended claims are intended to cover all modifications and/or changes as fall within claimed subject matter.

What is claimed is:

1. A method comprising:
    applying a dopant to a material comprising substantially a metal oxide or a metal chalcogenide, or a combination thereof, to form a correlated electron material (CEM); wherein:
    the dopant to provide a ligand to substantially bond with metal ions of the metal oxide or the metal chalcogenide, or a combination thereof; and
    wherein p-orbitals of oxygen atoms of the metal oxide, or p-orbitals of chalcogenide atoms of the metal chalcogenide, or a combination thereof, to form a hybridized orbital with s-p orbitals of metal ions in a valence band and a conduction band.

2. The method of claim 1, wherein application of the dopant is to reduce a bandgap in the CEM.

3. The method of claim 1, wherein the dopant comprises carbon and/or carbon monoxide, and the metal oxide comprises $Bi_2O_3$, and wherein the CEM comprises CO maintained in a lattice comprising $Bi_2O_3$.

4. The method of claim 1, wherein the dopant comprises carbon in a solid state, and wherein the metal oxide comprises $Bi_2O_3$, and wherein application of the dopant to the metal oxide comprises:
    a reduction of $Bi_2O_3$ to form a carbon monoxide gas and bismuth solid; and
    an oxidation of the bismuth by carbon dioxide to form $Bi_2O_3$ and additional carbon monoxide.

5. The method of claim 4, and further comprising varying amounts of carbon and/or carbon monoxide applied in the dopant so as to control a removal of O vacancies in the CEM and to maintain an amount of carbon monoxide in a lattice comprising $Bi_2O_3$.

6. The method of claim 1, wherein the metal oxide comprises an oxide of Bi, Pb, Zn, Cd, In, Sn, Sb, Hg, Tl, Ga or Ge, or any combination thereof.

7. The method of claim 1, wherein the metal chalcogenide comprises a chalcogenide of Bi, Pb, Zn, Cd, In, Sn, Sb, Hg, Tl, Ga or Ge, or any combination thereof.

8. The method of claim 1, wherein the metal chalcogenide comprises a metal chalcogenide of S, Se, or Te, or any combination thereof.

9. A method comprising:
    applying a dopant to a material comprising substantially a metal oxide or a metal chalcogenide, or a combination thereof, to form a correlated electron material (CEM), the dopant providing a ligand to substantially bond with metal ions of the metal oxide or the metal chalcogenide, or a combination thereof, wherein applying the dopant further comprises:
    applying an extrinsic ligand to the metal oxide or the metal chalcogenide, or the combination thereof; and
    varying an applied amount of the extrinsic ligand to impart an atomic concentration of the extrinsic ligand in the correlated electron material to achieve a predefined bandgap between conduction and valence bands of the correlated electron material or achieve a predefined electronegativity in the correlated electron material, or a combination thereof.

10. The method of claim 9, wherein the extrinsic ligand forms hybridized bonds with s- and p-orbitals of the metal ions to at least in part displace oxygen or a chalcogen in hybridized bonds with s- and p-orbitals of the metal ions.

11. The method of claim 10, wherein the predefined bandgap between the conduction and valence bands or predefined electronegativity in the correlated electron material, or a combination thereof, are achieved responsive at least in part to a degree of displacement of oxygen or a chalcogen in hybridized bonds with s- and p-orbitals of the metal ions by the extrinsic ligand.

12. The method of claim 9, wherein the metal oxide comprises an oxide of Bi, Pb, Zn, Cd, In, Sn, Sb, Hg, Tl, Ga or Ge, or any combination thereof.

13. The method of claim 9, wherein the metal chalcogenide comprises a chalcogenide of Bi, Pb, Zn, Cd, In, Sn, Sb, Hg, Tl, Ga or Ge, or any combination thereof.

14. The method of claim 9, wherein the metal chalcogenide comprises a metal chalcogenide of S, Se, or Te, or any combination thereof.

15. A method comprising:
    forming one or more layers of a bulk material between first and second metal layers, the one or more layers of the bulk material comprising substantially a metal oxide or a metal chalcogenide, or a combination thereof, the bulk material further comprising a ligand to bond with metal ions of the metal oxide or the metal chalcogenide, or the combination thereof, to impart a reversible back donation property, wherein p orbitals of oxygen atoms of the metal oxide or p- orbitals of chalcogenide atoms of the metal chalcogenide, or a combination thereof, form a hybridized orbital with s-p orbitals of metal ions in a valence band and a conduction band.

16. The method of claim 15, wherein the bulk material comprises a correlated electron material (CEM), and wherein the ligand is to reduce a bandgap in the CEM.

17. The method of claim 15, wherein the ligand comprises carbon and/or carbon monoxide, and the metal oxide comprises $Bi_2O_3$, and wherein the bulk material comprises CO maintained in a lattice comprising $Bi_2O_3$.

18. The method of claim 15, wherein the metal oxide comprises an oxide of Bi, Pb, Zn, Cd, In, Sn, Sb, Hg, Tl, Ga or Ge, or any combination thereof.

19. The method of claim 15, wherein the metal chalcogenide comprises a chalcogenide of Bi, Pb, Zn, Cd, In, Sn, Sb, Hg, Tl, Ga or Ge, or any combination thereof.

20. The method of claim 15, wherein the metal chalcogenide comprises a metal chalcogenide of S, Se, or Te, or any combination thereof.

* * * * *